(12) United States Patent
Aita et al.

(10) Patent No.: US 7,323,685 B2
(45) Date of Patent: Jan. 29, 2008

(54) ION BEAM PROCESSING METHOD

(75) Inventors: Kazuo Aita, Chiba (JP); Osamu Takaoka, Chiba (JP); Tomokazu Kozakai, Chiba (JP)

(73) Assignee: SII Nano Technology Inc. (JP)

( * ) Notice: Subject to any disclaimer, the term of this patent is extended or adjusted under 35 U.S.C. 154(b) by 278 days.

(21) Appl. No.: 10/543,843

(22) PCT Filed: Feb. 16, 2004

(86) PCT No.: PCT/JP2004/001658

§ 371 (c)(1),
(2), (4) Date: Oct. 3, 2005

(87) PCT Pub. No.: WO2004/075240

PCT Pub. Date: Sep. 2, 2004

(65) Prior Publication Data

US 2006/0097194 A1    May 11, 2006

(30) Foreign Application Priority Data

Feb. 18, 2003    (JP) .............................. 2003-039081

(51) Int. Cl.
*H01J 37/304*    (2006.01)

(52) U.S. Cl. ............... 250/309; 250/491.1; 250/492.21

(58) Field of Classification Search ................ 250/309, 250/491.1
See application file for complete search history.

(56) References Cited

U.S. PATENT DOCUMENTS 6,740,456 B2 *    5/2004    Kanamitsu ..................... 430/5
7,018,683 B2 *    3/2006    Takaoka et al. ............ 427/596

FOREIGN PATENT DOCUMENTS

JP    63305358 A    *    12/1988
JP    2000021347 A    *    1/2000

* cited by examiner

*Primary Examiner*—Jack I. Berman
(74) *Attorney, Agent, or Firm*—Adams & Wilks

(57) ABSTRACT

When scanning by an ion beam in advance an area 24 including a reference hole 23 formed at a position other than the area to be processed 25 of a light-shielding film 21 on a glass substrate 22, a secondary ion signal of the same atom as the incident ions injected into the substrate is detected instead of detecting the secondary ion signal of the atoms included in the base film, and the position 23 of the hole is stored. Then, the area 24 including the hole formed during the processing is scanned and the secondary ion signal of the same atom as the incident ions is detected to determine the current position 26 of the hole, the position of the hole obtained by the previous detection and the current position of the hole are compared, and the amount of shift of the position of the hole is determined. This shifted amount is regarded as the drift amount.

2 Claims, 2 Drawing Sheets

ION BEAM PROCESSING METHOD

CROSS-REFERENCE TO RELATED APPLICATIONS

This application is a U.S. national stage application of copending International Application No. PCT/JP2004/001658, filed Feb. 16, 2004, claiming a priority date of Feb. 18, 2003, and published in a non-English language.

TECHNICAL FIELD

The present invention relates to a processing method using a focused ion beam for modification, failure analysis, or repair of a photo mask defect of an integrated circuit.

BACKGROUND ART

In general, a processing apparatus using a focused ion beam uses its micro-processing capability for milling and thin-film accumulation in a gas atmosphere and its high positioning accuracy to carry out, for instance, failure diagnosis or correction of an integrated circuit, repair of photo mask defect, preparation of a sample of a cross-section of a semiconductor device for a transmission electron microscope (TEM), processing of a magnetic head using a magnetic resistance (MR) effect, or processing of a micro electro mechanical system (MEMS).

Since processing by the focused ion beam apparatus requires a long time in many cases, and high-accuracy processing is required, detection of drift amount in the course of processing and reduction of influence of the drift by fine-adjustment of an ion beam irradiation area with the drift taken into account has been performed. In order to find the drift amount with high degree of accuracy, a method including steps of: forming in advance a minute hole with the ion beam at a position of the sample other than the area to be processed; obtaining a secondary electron image of the area including the minute hole or a secondary ion image of the types of atoms included in the base film, to find the position of the minute hole in advance; starting the processing; obtaining again the secondary electron image of the area including the minute hole formed in the course of the processing or the secondary ion image of the types of atoms included in the base film; finding the shifted amount of the position of the minute hole; and fine-adjusting the ion beam irradiating area, is performed.

For example, in the case of a photo mask defect repairing apparatus, a minute hole is formed on a light-shielding film on a glass substrate at a position other than the area to be processed in advance by the ion beam, the area including the minute hole is scanned before processing, the position of the minute hole is detected from the secondary ion image of Si included in the glass substrate, and the position is registered. Subsequently, the processing of the defect area is started, then the processing is interrupted once in mid process for scanning the area including the formed minute hole again to find the current position of the minute hole from the secondary ion image of Si included in the glass substrate, fine-adjustment of the ion beam irradiation area is performed based on the difference from the registered position which is the drift amount, the processing is started again, and the registration of the current position of the hole is updated. Improvement of the processing accuracy is achieved by repeating calculation of the drift from detection of the position of the hole and comparison with the registered position, fine-adjustment of the ion beam irradiation area, and starting the processing again (for example, see JP-A-63-305358 (P. 3-4, FIG. 1)).

When correcting the drift amount in the image of the secondary ions included in the base substrate, if the amount of incident ions injected is too small, or the minute hole is too small, FIB-CVD source gas or gas for gas assist etching is adsorbed in the hole formed by the ion beam and hence the secondary ion image may become invisible. Therefore, the size of the hole must be increased. However, when the size of the hole is increased, accuracy of the drift correction is lowered. Also, when the size of the hole is increased, if an object to be repaired is the photo mask, the hole formed for the drift correction may also be transferred to the circuit.

When the photo mask is repaired using the photo mask defect repairing apparatus, if the size of the hole formed for the drift correction is too large, the hole formed for the drift correction is filled up with the FIB-CIV film after the processing is completed. However, depending on the shielding film patterns, there are cases in which the film is not adhered because the primary beam consists of Ga and instead further etching is done, whereby it becomes easier for the hole to be transferred, or even if the hole is filled up, another defect is generated on the glass substrate around the hole due to the halo caused by the tail component of the beam.

When scanning an area of the light-shielding film including the minute hole formed at a position other than the area to be processed on the glass substrate by the ion beam in advance, secondary ion signals of the same atoms as the ion beam injected into the substrate are detected, not the secondary ion signals of the atoms included in the base film, and the position of the hole is stored. Then, during the processing, the area including the hole formed is scanned and the secondary ion signals of the same atom as the incident ion are again detected to detect the position of the hole, the position of the hole previously detected and the current position of the hole are compared to obtain the amount of shift of the position of the hole, and with this shifted amount regarded as the drift amount, the processing is started again in the irradiation area which offsets the drift amount.

Since the secondary ion of the same atomic species as the incident ion beam is detected when determining the position of the hole, there is no possibility that the secondary ion can be difficult to detect due to the injection of the incident ion and hence the secondary ion image is difficult to see as in the conventional art. In addition, when the hole is minute, even though FIB-CVD source gas or gas for gas assist etching is adsorbed to the hole, the intensity of the secondary ion detected at the hole increases because the hole has been injected with the incident ion every time when the area including the hole is scanned, and hence even the minute hole can be detected more easily than in the conventional art, and hence the drift can be corrected with high degree of accuracy. Further, when the ion source is gallium (Ga), there is the advantage that gas is not readily adsorbed to a surface layer in which gallium is injected.

When repairing the photo mask by the photo mask defect repairing apparatus, since the drift is corrected by a minute hole which is as small as a half of the wavelength of a reduced projection exposure apparatus, the hole formed for detecting the drift amount is not transferred. Since it is not necessary to fill up the hole, the problem caused by filing the hole as described above does not occur.

BEST MODE FOR CARRYING OUT THE INVENTION

Hereinafter, referring a photo mask defect repairing apparatus as an ion beam processing apparatus, an embodiment of the present invention will be described.

Figure 1:
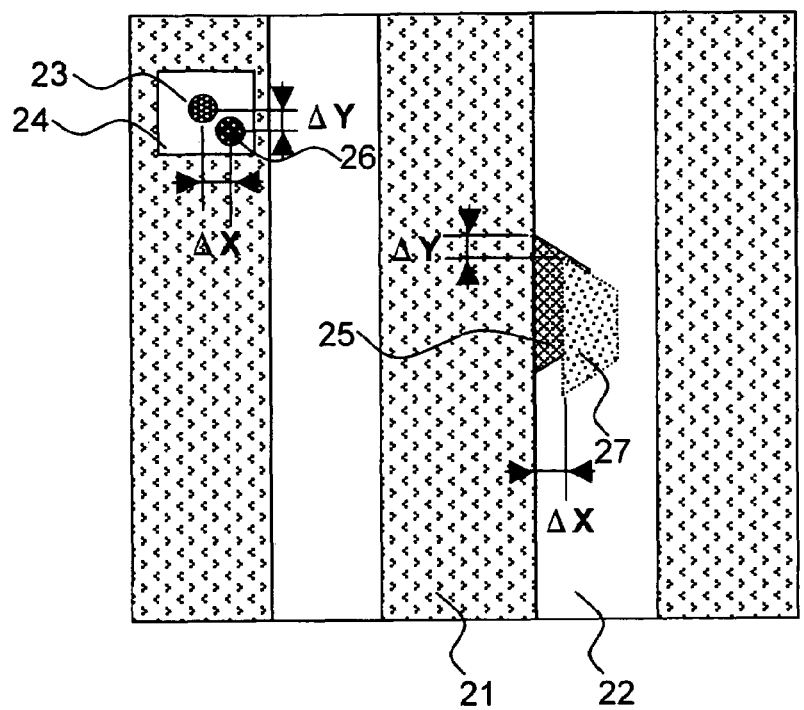
FIG. 1 is an explanatory drawing showing characteristics of the present invention most clearly.
Figure 2:
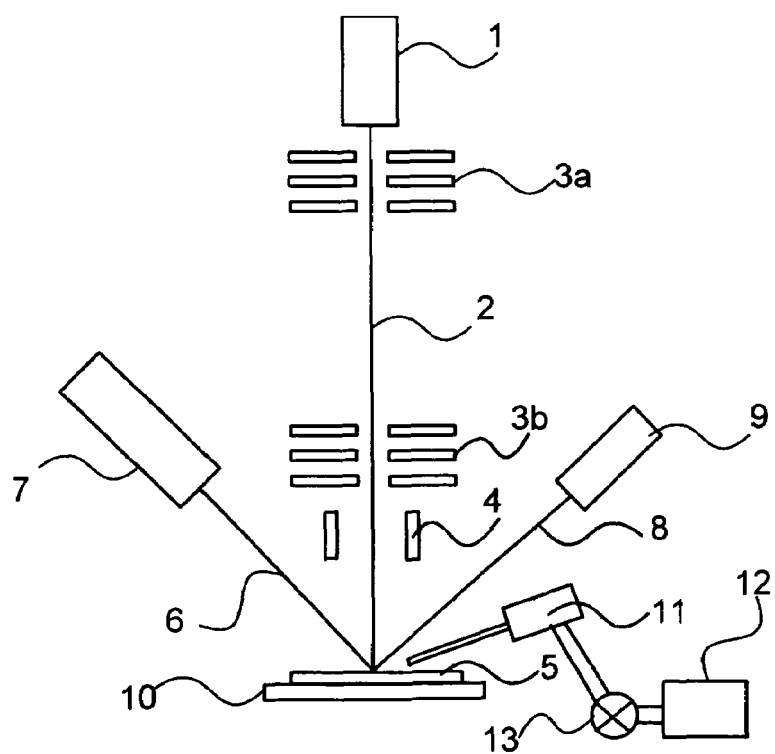
FIG. 2 is a block diagram of a photo mask repair apparatus for explaining an embodiment of the present invention.

A photo mask (binary mask or phase shift mask) 5 including a defect is introduced into a vacuum chamber of an ion beam defect repairing apparatus as shown in FIG. 2, and a XY stage 10 is moved to the position of the defect which has been determined by a defect inspection apparatus. An ion beam 2 discharged from an ion source 1 and accelerated to 20 to 30 kV is focused by a condensing lens 3a and an objective lens 3b and injected on the sample. A secondary electrons or a secondary ions 6 generated when the ion beam 2 passing through a polarizer 4 scans the photo mask 5 is detected by a secondary electron detector or a secondary ion detector 7 synchronously with the scanning operation. Then, the position for the minute hole is determined from the secondary electron image or secondary ion image, and a minute hole 23 of 0.1 μm or smaller as shown in FIG. 1 is formed. The photo mask 5 is a conductive light-shielding film pattern 21 deposited on a glass substrate 22 as an insulative material. Therefore, when observing the secondary electron image or the secondary ion image, the light-shielding film pattern 21 is charged with positive ions of the ion beam so that the secondary electron image or the secondary ion image may become invisible. Therefore, an electron beam 8 which is accelerated to several hundreds of volts and focused is emitted by a charge neutralization electron gun 9 and thus a site whose charge is neutralized is observed. After having formed the hole, an area 24 including the hole is scanned by the ion beam and the secondary ion of the same atom as the incident ion beam is detected, so that the position where the hole 23 is formed is detected and recorded.

Then, a secondary electron image or a secondary ion image of an area including a defect is obtained, and a defect repairing area 25 (clear defect or opaque defect) is recognized. A gas introduction valve 13 is opened only in the area 25 which is recognized as having the clear defect or the opaque defect, scanning is performed selectively while pouring the starting material for shielding film (for clear defect) or assist gas for performing processing while maintaining a high transmissibility 11 (for opaque defect) from a gas gun 12 for processing the defect area 25. The processing is interrupted in mid process, the minute area 24 around the position 23 which has been stored in the memory of the apparatus as the position where the hole is formed is scanned, secondary ions of the same atom as the incident ion beam 2 are detected to obtain and store the current position 26 of the reference hole. Since it is considered that the position to be processed by the ion beam is moved in the same direction and by the same amount as the displacement of the reference hole by drift, differences $\Delta X$ and $\Delta Y$ with respect to the stored previous position are regarded as a drift amount, and the processing is started again in an ion beam irradiation area 27 which is offset by the amount of $\Delta X$ and $\Delta Y$ from the ion beam irradiation area 25 of the previous processing. By repeating this interruption of processing, detection of the hole position, calculation of the drift amount from comparison with the stored hole position, fine-adjustment of the processing area with the drift taken into consideration, and restarting of the processing, the drift is corrected and the processing with high degree of accuracy is performed.

Figure 3:
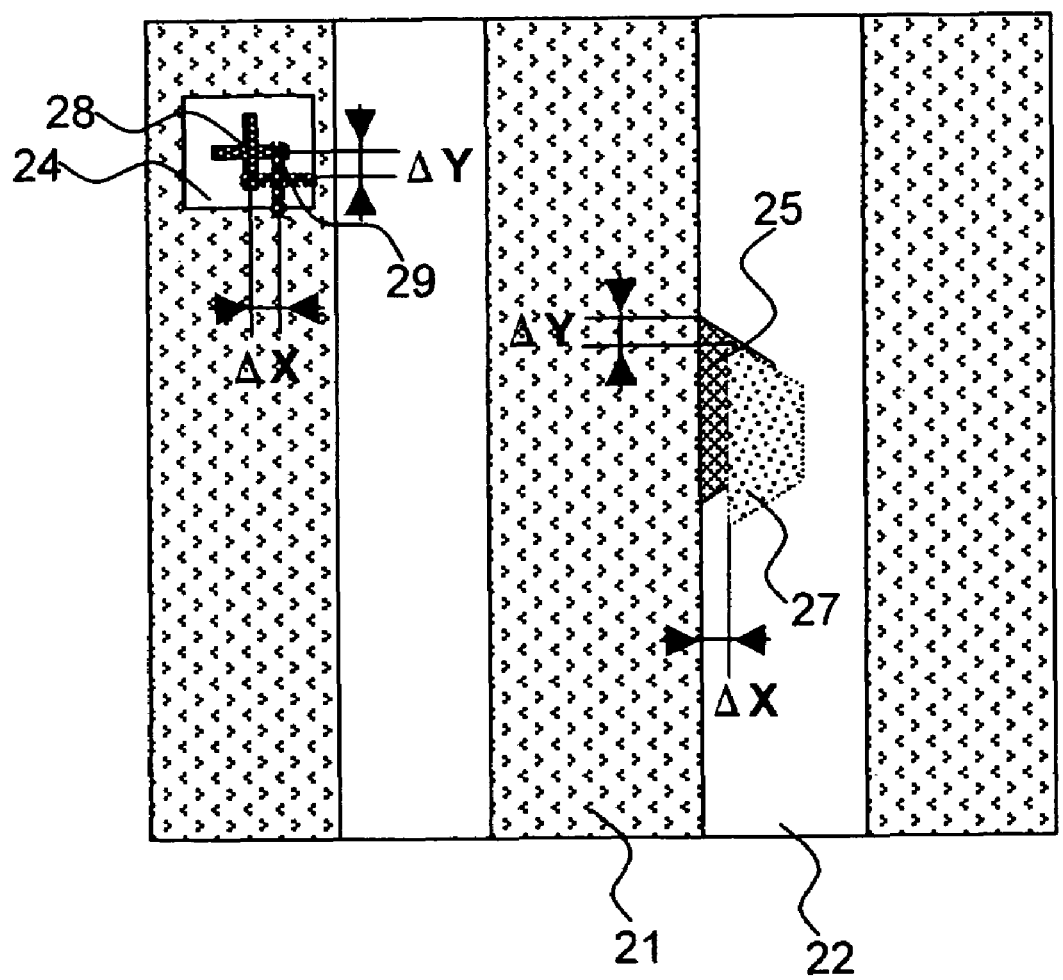
FIG. 3 is an explanatory drawing showing the embodiment of the present invention.

In the aforementioned repair of a defect, alternatively, a characteristic pattern 28 is formed on the light-shielding film pattern 21 by the ion beam instead of forming a minute hole as shown in FIG. 3, and midway during the processing the secondary ions of the same atom as the incident ion beam 2 in the area 24 including the pattern are detected and a pattern 29 is observed. Then, the drift amount $\Delta X$ and $\Delta Y$ are detected by the pattern matching between the obtained image 29 and the previous image 28, and the processing is started again in a irradiation area 27 which is offset from the ion beam irradiation area of the previous processing 25 by the drift amount $\Delta X$ and $\Delta Y$. By repeating interruption of the processing, detection of the pattern, calculation of the drift amount from the pattern matching, fine-adjustment of the processing area with the drift taken into consideration, and restarting of the processing, the drift can be corrected to perform the processing with high degree of accuracy.

INDUSTRIAL APPLICABILITY

As described above, according to the present invention, when midway during the processing the area including the formed hole is scanned, since the amount of shift of the position of the minute hole is detected based on the distribution of intensity of the incident ion injected into the substrate, and the ion beam irradiation area is finely adjusted with the amount of this shift regarded as the drift amount, a phenomenon such as where the secondary ion becomes invisible due to injection of the incident ion does not occur. Also, even though the FIB-CVD source gas or the gas for gas assist etching is adsorbed in the minute hole, since the incident ion is injected and hence the hole is refreshed every time when the area including the hole is scanned, the secondary ion signal is prevented from being invisible, and hence the drift can be corrected with high degree of accuracy. In the case where the photo mask is repaired by the photo mask defect repairing apparatus, since the drift correction can be performed with a minute hole which is as small as a half of the wavelength of a reduced projection exposure apparatus or even smaller, the hole formed for detecting the drift is not transferred to the circuit. Since it is not necessary to fill up the hole, the problem caused by filling the hole does not occur. As a matter of course, the present invention can be applied not only to a photo mask repair apparatus, but also to other ion beam processing apparatus.

The invention claimed is:

1. An ion beam processing method comprising steps of: forming a minute reference hole in an area of a sample other than the area to be processed in advance before performing processing by a focused ion beam; scanning the area including the formed reference hole before processing the desired area and also midway during processing of the same; calculating the amount of shift of the position of the reference hole based on the secondary ion image of the same atom as the incident ion beam; and correcting the ion beam irradiation position based on the shift amount, thereby processing while correcting for the drift of the ion beam irradiation position during processing.

2. An ion beam processing method comprising steps of: forming a characteristic pattern in an area on the sample other than the area to be processed in advance before performing processing by a focused ion beam; scanning the area including the formed characteristic pattern before processing the area to be processed and also midway during processing of the same; calculating the amount of shift by performing pattern matching with the secondary ion image of the same atom as the incident ion beam; and correcting the ion beam irradiation position based on the shift amount, thereby processing while correcting for the drift of the ion beam irradiation position during processing.

* * * * *